United States Patent
Kusuda

(10) Patent No.: US 7,255,899 B2
(45) Date of Patent: Aug. 14, 2007

(54) HEAT TREATMENT APPARATUS AND HEAT TREATMENT METHOD OF SUBSTRATE

(75) Inventor: Tatsufumi Kusuda, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 464 days.

(21) Appl. No.: 10/290,435

(22) Filed: Nov. 7, 2002

(65) Prior Publication Data

US 2003/0089132 A1    May 15, 2003

(30) Foreign Application Priority Data

Nov. 12, 2001 (JP) .............................. 2001-346550
Mar. 25, 2002 (JP) .............................. 2002-082921
Oct. 7, 2002 (JP) .............................. 2002-293665

(51) Int. Cl.
B05D 3/06 (2006.01)
B05D 3/02 (2006.01)

(52) U.S. Cl. ....................... 427/559; 427/557; 438/795

(58) Field of Classification Search ..................... None
See application file for complete search history.

(56) References Cited

U.S. PATENT DOCUMENTS

| | | | | |
|---|---|---|---|---|
| 4,356,384 A | * | 10/1982 | Gat ............................. | 392/418 |
| 4,504,323 A | * | 3/1985 | Arai et al. ................... | 438/795 |
| 4,544,418 A | * | 10/1985 | Gibbons ...................... | 438/565 |
| 4,567,352 A | * | 1/1986 | Mimura et al. ............. | 219/405 |
| 4,571,486 A | * | 2/1986 | Arai et al. ................... | 438/799 |
| 4,820,906 A | * | 4/1989 | Stultz ........................... | 219/405 |
| 4,859,832 A | * | 8/1989 | Uehara et al. .............. | 219/411 |
| 4,965,225 A | * | 10/1990 | Yamagishi et al. ......... | 438/795 |
| 5,073,698 A | | 12/1991 | Stultz | |
| 6,376,806 B2 | * | 4/2002 | Yoo ............................ | 219/411 |
| 6,594,446 B2 | * | 7/2003 | Camm et al. ............... | 392/416 |
| 6,770,519 B2 | * | 8/2004 | Ito et al. ..................... | 438/197 |
| 6,859,616 B2 | * | 2/2005 | Kusuda et al. .............. | 392/416 |

(Continued)

FOREIGN PATENT DOCUMENTS

JP    55-103721 A  *  8/1980

(Continued)

OTHER PUBLICATIONS

English translation of Abstract for Japanese Application Laid-Open No. 10-172919 (1998).

(Continued)

*Primary Examiner*—Marianne Padgett
(74) *Attorney, Agent, or Firm*—Ostrolenk, Faber, Gerb & Soffen, LLP

(57) ABSTRACT

A heat diffusion plate and a heating plate are placed in a heat treatment chamber in this order. The heating plate is used for preliminarily heating a glass substrate to a temperature in a range from 200° C. to 400° C. The glass substrate thus preliminarily heated is subjected to a heat treatment by flash light irradiation by a xenon flash lamp. The flash light irradiation makes it possible to uniformly heat an amorphous silicon film on the glass substrate, and consequently to be poly-crystallized. Thus, it becomes possible to provide a heat treatment technique capable of carrying out a uniform heat treatment on the silicon film on the glass substrate sufficiently.

4 Claims, 11 Drawing Sheets

U.S. PATENT DOCUMENTS

| | | | |
|---|---|---|---|
| 7,062,161 B2 * | 6/2006 | Kusuda et al. | 392/418 |
| 7,072,579 B2 * | 7/2006 | Kusuda | 392/416 |
| 7,091,114 B2 * | 8/2006 | Ito et al. | 438/527 |
| 7,183,229 B2 * | 2/2007 | Yamanaka | 438/795 |
| 2003/0022471 A1 * | 1/2003 | Taketomi et al. | 438/496 |
| 2003/0193066 A1 * | 10/2003 | Ito et al. | 257/335 |
| 2005/0062107 A1 * | 3/2005 | Ito et al. | 257/355 |
| 2005/0124129 A1 * | 6/2005 | Ito | 438/308 |
| 2006/0081596 A1 * | 4/2006 | Kusuda et al. | 219/411 |
| 2006/0292759 A1 * | 12/2006 | Ito | 438/149 |

FOREIGN PATENT DOCUMENTS

| | | | |
|---|---|---|---|
| JP | 55-103722 A | * | 8/1980 |
| JP | 57-162340 | * | 10/1982 |
| JP | 594995 | | 4/1993 |
| JP | 10172919 | | 6/1998 |
| JP | 2001110738 | | 4/2001 |
| JP | 3197707 | | 6/2001 |

OTHER PUBLICATIONS

English translation of Abstract for Japanese Application Laid-Open No. 2001-110738 (2001).

English translation of Abstract for Japanese Application No. 3197707 (2001).

* cited by examiner

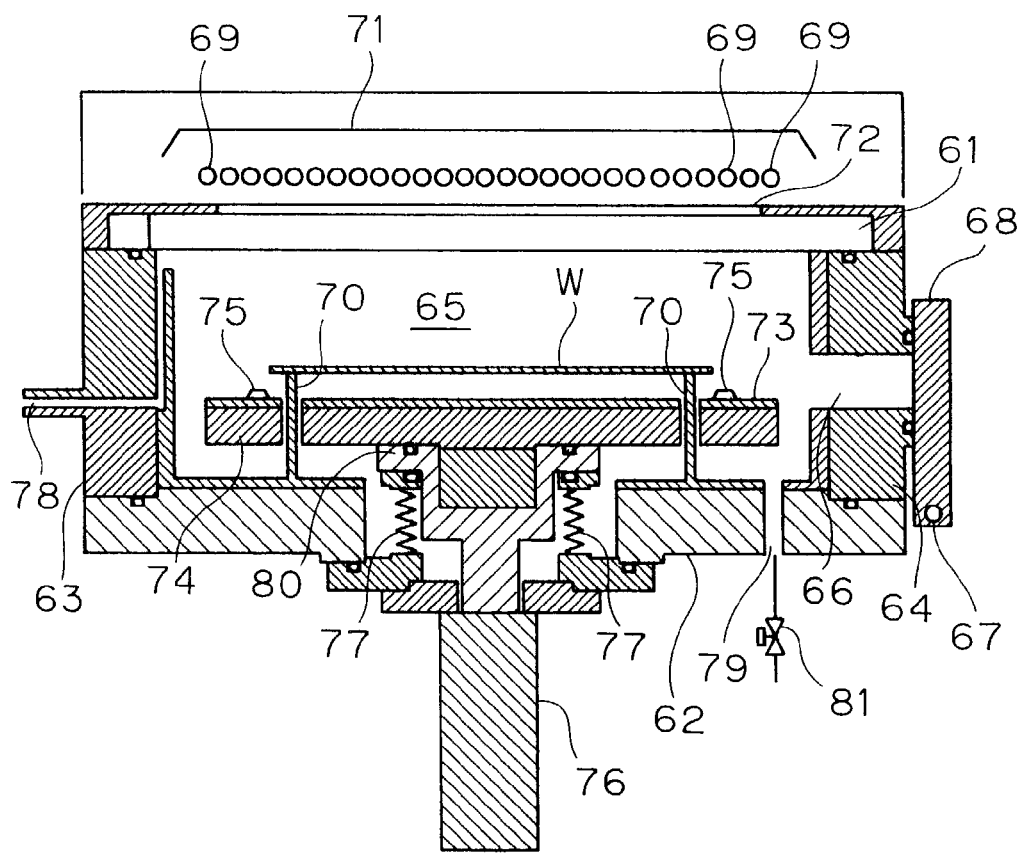
F I G . 1

F I G . 6
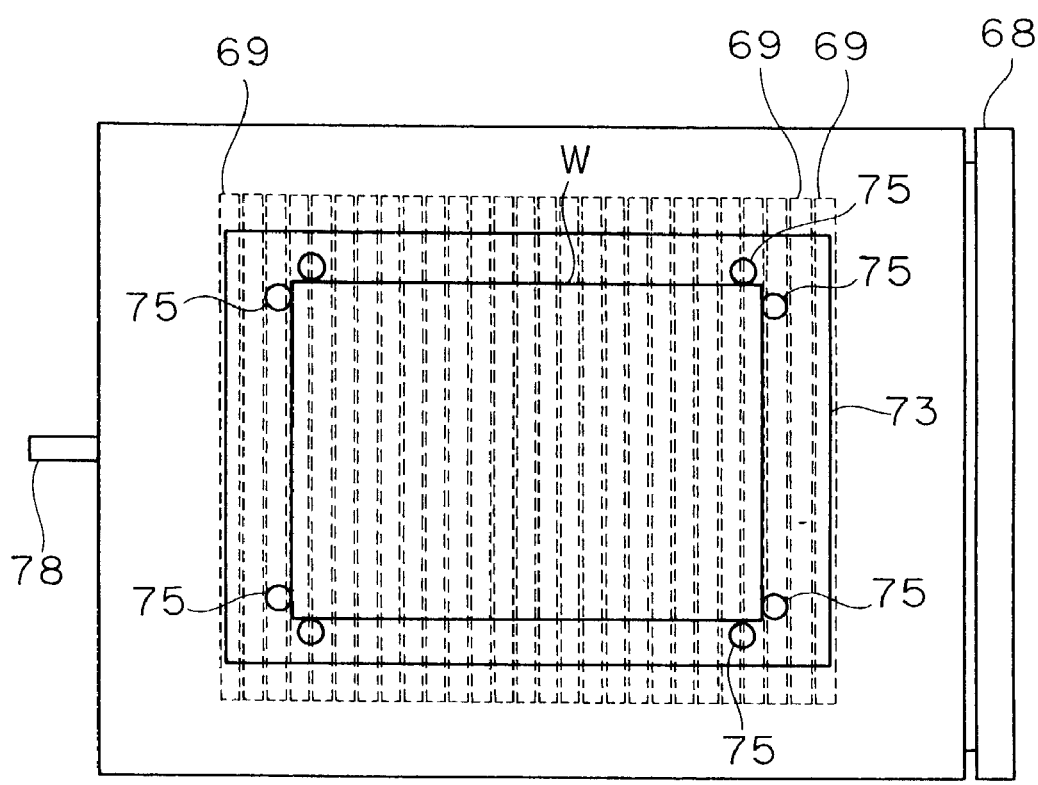

F I G. 1 2
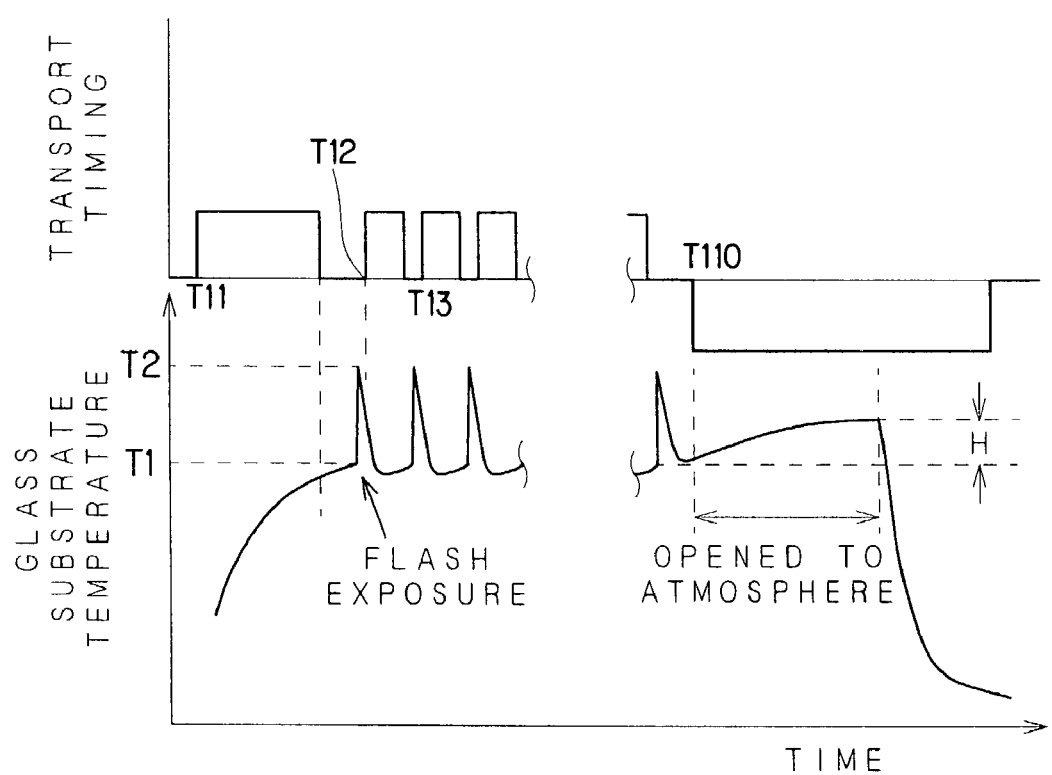

HEAT TREATMENT APPARATUS AND HEAT TREATMENT METHOD OF SUBSTRATE

BACKGROUND OF THE INVENTION

1. Field of the Invention

The present invention relates to a heat treatment method and an apparatus for a substrate, which improve characteristics of the substance by applying light thereto and are preferably used, in particular, when an amorphous silicon film is formed into a polycrystalline film upon manufacturing a semiconductor substrate and a thin-film transistor (TFT) or the like to be used for a liquid crystal display apparatus.

2. Description of the Background Art

A small-size, high precision active-matrix-type liquid crystal display (LCD) panel, which uses a polycrystalline silicon thin-film transistor (TFT) as its switching element, has been developed for use in a high-resolution display. The application of a polysilicon TFT to an active element of an LCD makes it possible to form a pixel array unit and a driving array unit on the same transparent insulating substrate in the same process; thus, the resulting advantage is that processes, such as wire bonding and packaging of driving ICs, can be eliminated.

The polycrystalline silicon TFT technique is a technique for assembling a thin-film transistor (TFT) by using a semiconductor thin film (with a thickness of approximately several tens to several hundreds nm) formed on a substrate having an insulating surface. When the TFT is applied as a switching element of an LCD, a driving frequency of not less than several hundreds kHz is required for the driving circuit, with the result that in order to form a driving circuit, a TFT which utilizes a polycrystal silicon film (polysilicon film) as an active layer is required.

Conventionally, with respect to a technique for manufacturing a polysilicon film at low costs, there has been proposed a heat treatment method which applies light to an amorphous silicon thin film or a material that has been made amorphous by ion-injecting silicon into a polycrystalline silicon thin film so as to poly-crystallize the film. For example, an $SiO_2$ (silicon oxide) film is formed as an insulating film serving as a base film on a glass substrate, and an amorphous silicon film is formed on the $SiO_2$ film by using a reduced-pressure CVD (Chemical Vapor Deposition) method, and this is subjected to heat treatments such as a laser annealing process, a solid phase growth process and a lamp annealing process so that the amorphous silicon film is crystallized to form a polysilicon film.

By doping this polysilicon film with a predetermined amount of donor and acceptor, a channel formation area, a drain area and the like are formed. Moreover, by forming a gate insulating film, a gate electrode, a source electrode, a drain electrode, an interlayer insulating film, etc. thereon, a thin-film transistor is formed, and a semiconductor device including such a thin-film transistor is manufactured.

In the case when a crystallized polysilicon film is doped with an impurity such as phosphor and boron, a light irradiation process is applied thereto so as to activate the impurity injected through the doping process and modify the interface of the film.

However, the following problems have been raised in the conventional example having such an arrangement.

In the above-mentioned conventional light-irradiation heat treatment system, the crystallization of the polysilicon film is greatly influenced by the degree of heating in the heat treatment process (for example, laser irradiation energy, laser wavelength or the like in the laser annealing process). Consequently, the transistor characteristics of the resulting thin-film transistor change greatly in response to the degree of heating sensitively. In other words, in the case when a laser annealing process is carried out by setting a specific laser irradiation energy, if this energy is varied due to deviations in the characteristics of the irradiation apparatus and a change in the operational environment such as the operation temperature, the deviations in crystallization of the polysilicon film formed through the laser annealing process become greater, with the result that the threshold voltage in the thin-film transistor tends to deviate from the designed value greatly in a range of approximately several volts.

For this reason, it is not possible to obtain a thin-film transistor, etc. having desired transistor characteristics stably unless the laser irradiation energy is controlled with extremely high precision upon practical use at the time of the laser annealing process. In other words, the application of standard laser irradiation apparatuses, etc. currently used widely makes it difficult to manufacture a semiconductor device including a thin-film transistor, etc. having desired transistor characteristics, and tends to cause malfunctions in the resulting semiconductor device and a higher rate of defective products.

Moreover, in the case of a lamp annealing process using a halogen lamp, the light-emitting energy of a light-emitting area to be absorbed in a silicon film is not sufficiently high, and it is necessary to provide a means for increasing light intensity or for making the irradiation time longer in order to carry out a sufficient process. However, such a method increases not only the temperature of the silicon film on the glass substrate but also the temperature of the glass substrate to a level exceeding the necessary temperature, resulting in a warp and a distortion in the substrate.

In the above-mentioned conventional light irradiation heat treatment system, in order to meet the demands for large-size liquid crystal glass TFT substrates, a technique has been proposed in which a light irradiation process is carried out on the entire surface of a substrate by allowing a large-size substrate to pass through a light irradiation area of a light source, by relatively shifting the light source and the large-size substrate. The advantage of this arrangement is that processes are continuously carried out on the large-size substrate. Moreover, a heat treatment apparatus, which preliminarily heats the substrate by using a pre-heating part before the light irradiation of the light sources, has been proposed. Here, with respect to the pre-heating part used for the above-mentioned heat treatment apparatus, a light source such as a lamp is used. With respect to the light source, a flash lamp or the like is used so that flash light is applied to the surface of the substrate to raise only the temperature of the silicon film in a short time.

However, in the case when the flash light is applied so as to raise the temperature of the surface of the substrate, the flash light and heat radiation that have passed through the substrate tend to cause burning of a filament and degradation in the lamp of the pre-heating part.

SUMMARY OF THE INVENTION

The present invention is directed to a heat treatment method which carries out a heating process on a substrate by applying light onto the substrate.

According to the present invention, the heat treatment method includes the steps of: a) loading a glass substrate having a silicon film formed thereon into a heat treatment chamber; b) preliminarily heating the glass substrate loaded into the heat treatment chamber; c) after having heated the glass substrate in the treatment chamber to a predetermined pre-heating temperature, applying flash light onto the glass substrate so that the pre-heated glass substrate is heated to a treatment temperature; and d) carrying out the glass substrate from the heat treatment chamber.

Thus, it becomes possible to carry out a heat treatment process uniformly on the silicon film by using light irradiation, and consequently to relatively easily form a semiconductor element such as a thin-film transistor having constant and good characteristics on the substrate.

The present invention is also directed to a heat treatment apparatus which carries out a heating treatment on a substrate by applying light onto the substrate.

According to the present invention, the heat treatment apparatus includes a heat treatment chamber which holds the substrate having a silicon film formed on the surface thereof, a pre-heating part which preliminarily heats the substrate held in the heat treatment chamber, and a flash heating part which applies flash light to the silicon film on the substrate which has been heated to a preset pre-heating temperature by the pre-heating part so that the silicon film is heated to a treatment temperature.

Thus, it is possible to carry out a heat treatment process uniformly by using light irradiation onto the silicon film, and consequently to relatively easily form a semiconductor element such as a thin-film transistor having constant and good characteristics on a substrate.

According to another aspect of the present invention, the heat treatment apparatus includes a pre-heating part which is placed on the rear face side of the substrate, and preliminarily heats the substrate at light irradiation area formed on the rear face side of the substrate by using light irradiation through a light-converging device, and a flash heating part which is placed on the surface side of the substrate, and, after the substrate has been heated to the preliminarily set pre-heating temperature, applies flash light onto the surface of the substrate, located at the same position as the light irradiation area, through the light-converging device so that the substrate is heated to a treatment temperature, wherein the pre-heating part and the flash heating part are placed in a tilted manner in the same direction with respect to the normal line of the substrate.

Since neither the pre-heating part nor the flash heating part is exposed to irradiation light mutually emitted from each other, it is possible to prevent deterioration in the parts.

Therefore, an object of the present invention is to provide a heat treatment method and apparatus for a substrate, which can relatively easily form a semiconductor element such as a thin-film transistor having constant and good characteristics on the substrate.

Another object of the present invention is to provide a heat treatment apparatus which can carry out stable operations while suppressing deterioration in the parts.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a side cross-sectional view showing a heat treatment apparatus in accordance with a first embodiment;

FIG. 6 is a schematic plan view that shows a heat treatment apparatus of the first embodiment;

FIG. 12 is a graph that shows transition of treatment temperatures of the glass substrate and transport timing in accordance with the second embodiment.

DESCRIPTION OF THE PREFERRED EMBODIMENTS

Referring to Figures, the following description will discuss embodiments of the present invention in detail.

1. First Embodiment

Figure 2:
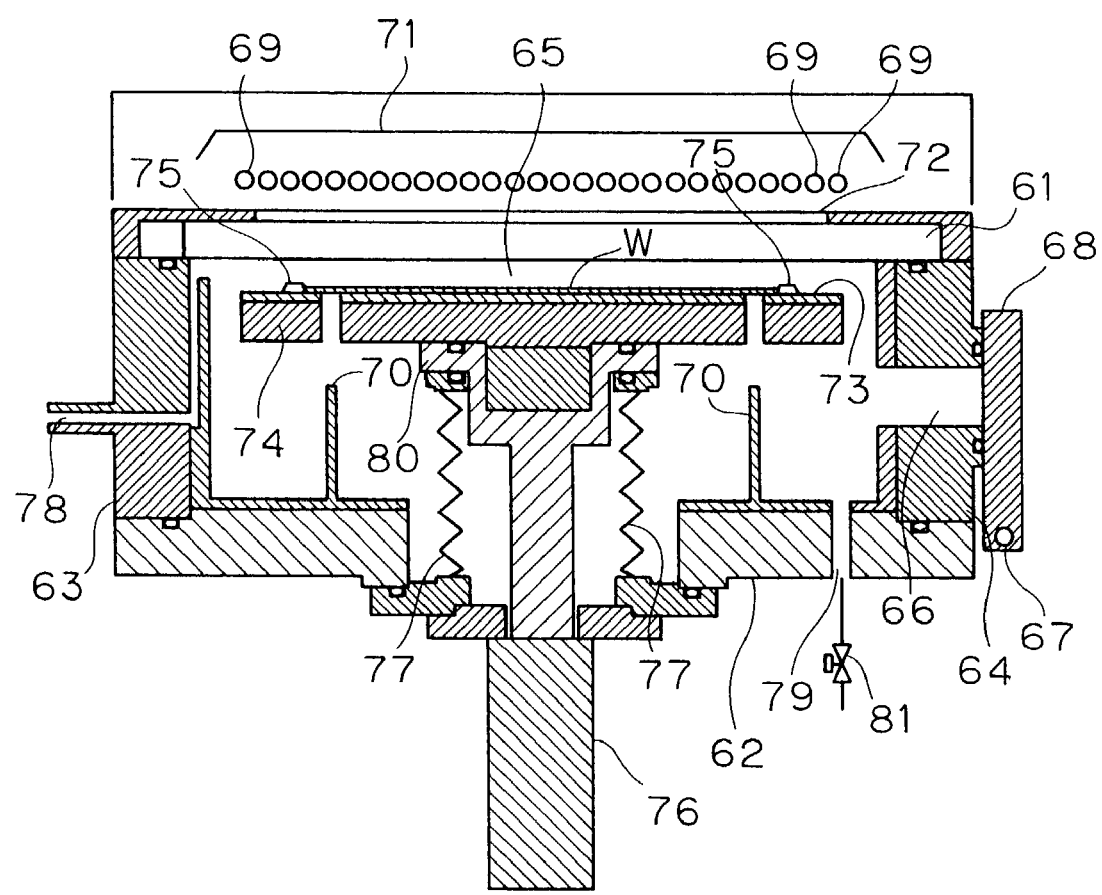
FIG. 2 is a side cross-sectional view showing the heat treatment apparatus in accordance with the first embodiment.
Figure 3:
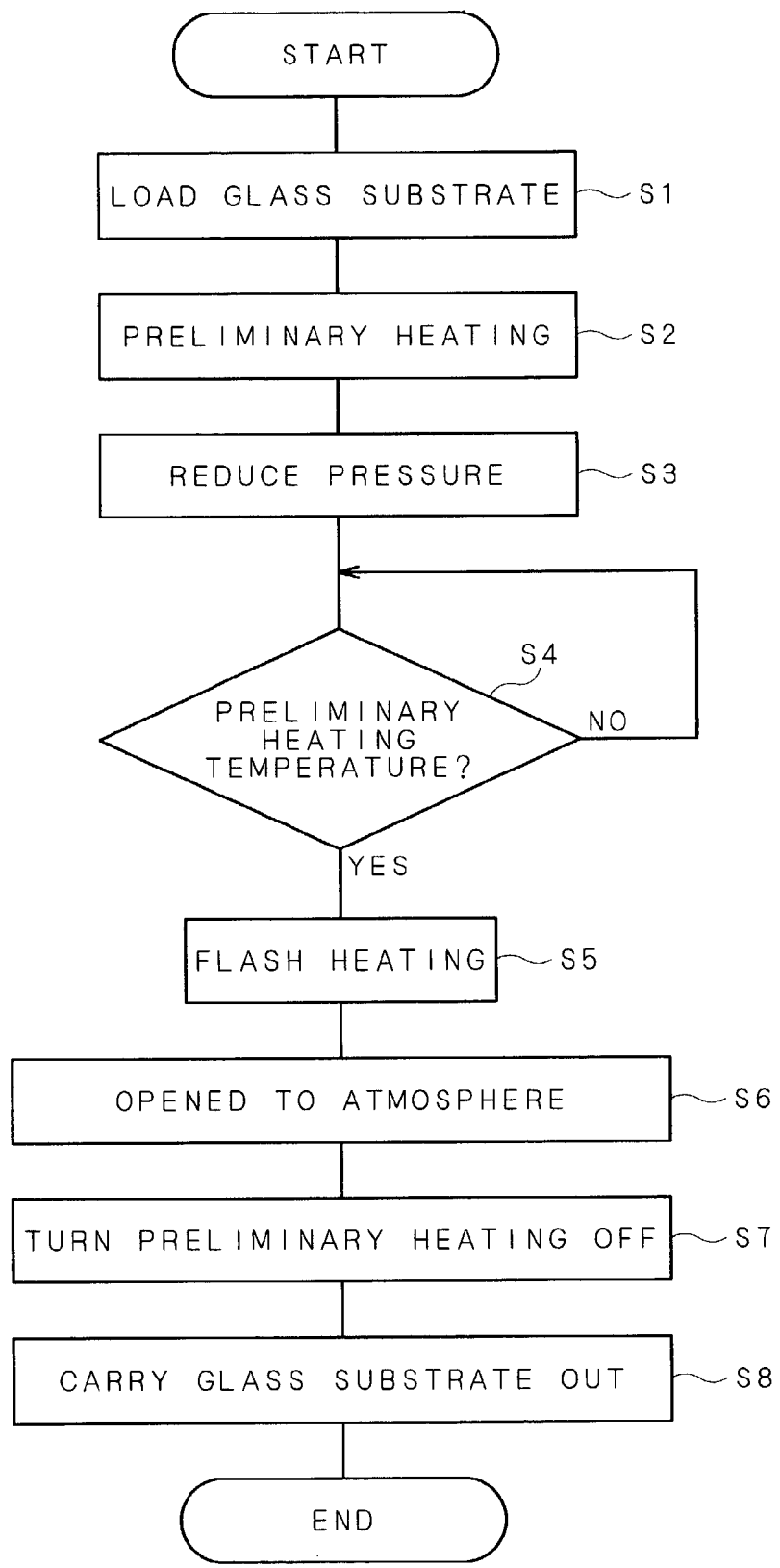
FIG. 3 is a flow chart that shows a sequence of heat treatment operations on a glass substrate by the heat treatment apparatus in accordance with the first embodiment.

FIGS. 1 and 2 are cross-sectional views of a heat treatment apparatus in accordance with a first embodiment of the present invention, and FIG. 3 is a schematic plan view thereof.

This heat treatment apparatus is constituted by a translucent plate 61, a bottom plate 62 and a pair of side plates 63, 64, and provided with a heat treatment chamber 65 in which a glass substrate W bearing an amorphous silicon film formed thereon is housed and subjected to a heat treatment thereon. The translucent plate 61 constituting the heat treatment chamber 65 is made of a material such as quartz having an infrared-ray transmitting property. Moreover, supporting pins 70, which penetrates a heat diffusion plate 73 and a heating plate 74, which will be described later, and supports the glass substrate W from its lower face, are formed on the bottom plate 62 constituting the heat treatment chamber 65 in a manner so as to stick out therefrom.

Moreover, an opening section 66 to and from which the glass substrate W is loaded and carried out is formed in the side plate 64 that constitutes the heat treatment chamber 65. The opening section 66 can be opened and closed by a gate valve 68 that is allowed to pivot centered on an axis 67. The glass substrate W is loaded into the heat treatment chamber 65 by a transporting robot, not shown, with the opening section 66 being opened.

A plurality of rod-shaped xenon flash lamps 69 (21 lamps in the present embodiment) are placed in parallel with each other above the heat treatment chamber 65. Moreover, a reflector 71 is placed above the xenon flash lamps 69. Here, FIG. 6 is a plan view that schematically shows a layout relationship between the xenon flash lamps 69 in accordance with the present embodiment and a heat diffusing plate 73, which will be described later.

This xenon flash lamp 69 is provided with a glass tube which has xenon gas sealed therein with an anode and a cathode connected to a capacitor being placed on the two ends thereof, and a trigger electrode that is wound on the periphery of this glass tube. Since the xenon gas is an electrically insulating material, no electric current is allowed to flow through the glass tube in a normal state. However, when a high voltage is applied to the trigger electrode to break the insulation, the electricity accumulated in the capacitor is allowed to flow through the glass tube so that the resulting Joule heat heats the xenon gas to emit light. In this xenon flash lamp 69, electrostatic energy, preliminarily stored therein, is converted into extremely short light pulses in a range from not less than 0.1 msec. to not more than 10 msec. so that it is possible to apply an extremely stronger light in comparison with a light source of a continuous lighting system.

A light diffusion plate 72 is placed between the xenon flash lamp 69 and the translucent plate 61. A material which is formed by applying light diffusion coating onto the surface of a quartz glass as an infrared transmitting material is used as this light diffusion plate 72.

A heat diffusion plate 73 and a heating plate 74 are placed in the heat treatment chamber 65 in this order. Positional off-set preventing pins 75 for the glass substrate W are placed on the surface of the heat diffusion plate 73.

The heating plate 74 is used for preliminarily heating the glass substrate W. The heating plate 74 is made from aluminum nitride, and has a structure in which a heater and a sensor for controlling this heater are housed. Here, the heat diffusion plate 73 is used for uniformly heating the glass substrate W by diffusing thermal energy from the heating plate 74. With respect to the material for this heat diffusion plate 73, a material having a comparatively small thermal conductivity, such as sapphire (aluminum oxide) and quartz, is adopted.

The heat diffusion plate 73 and the heating plate 74 are arranged so as to be raised and lowered between the loading and carrying-out position of the glass substrate W shown in FIG. 1 and the heat treatment position of the glass substrate W shown in FIG. 2, by driving operations of an air cylinder 76.

The loading and carrying-out position shown in FIG. 1 is a position in which the heat diffusion plate 73 and the heating plate 74 are lowered so as to place the glass substrate W transported from the opening section 66 by using a transporting robot, not shown, onto the supporting pin 70 or carry out the glass substrate W placed on the supporting pin 70 from the opening section 66. In this state, the upper end of the supporting pin 70 is allowed to pass through a through hole formed in the heat diffusion plate 73 and the heating plate 74, and placed above the surface of the heat diffusion plate 73.

In the heat treatment apparatus of the glass substrate W shown in FIG. 2, the heat diffusion plate 73 and the heating plate 74 are placed at raised positions above the upper end of the supporting pin 70 so as to carry out a heat treatment on the glass substrate W. In this state, the glass substrate W is raised with its lower face being supported by the surface of the heat diffusion plate 73, and placed at a position close to the translucent plate 61.

Additionally, bellows 77 are placed between a supporting member 80 for supporting the heating plate 74 and the bottom plate 62 of the heat treatment chamber 65 so as to prevent particles, generated upon raising and lowering the heat diffusion plate 73 and the heating plate 74 between the loading and carrying-out position of the glass substrate W and the heat treatment position, from adhering to the glass substrate W.

An introduction path 78 is formed in a side plate 63 on an opposite side to the opening section 66 in the heat treatment chamber 65. This introduction path 78 is used for introducing air at the time of a releasing process to atmosphere, which will be described later. Here, instead of introducing air, nitrogen gas or the like may be introduced.

Here, a discharge path 79 is formed in the bottom plate 62 of the heat treatment chamber 65. This discharge path 79 is connected to a pressure-reducing mechanism, such as a vacuum pump, through an open-close valve 81.

Figure 4:
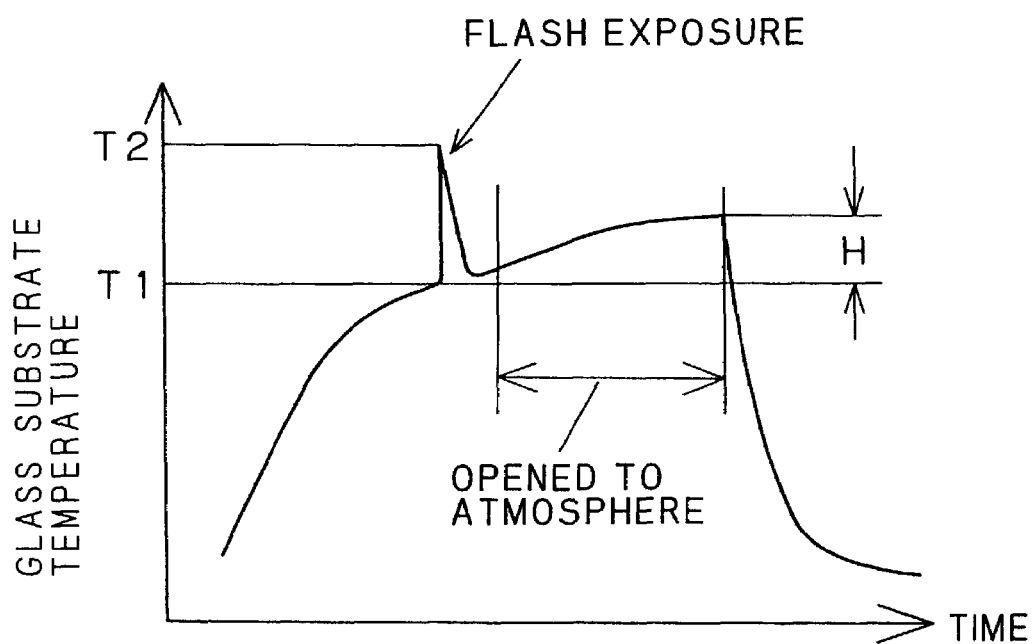
FIG. 4 is a graph that shows transition of treatment temperatures, etc., on the glass substrate of the first embodiment.

Next, the following description will discuss heat treatment operations of the glass substrate W carried out by the heat treatment apparatus of the first embodiment. FIG. 3 is a flow chart that shows the heat treatment operations of the glass substrate W carried out by the heat treatment apparatus in accordance with the present invention, and FIG. 4 is a graph that shows the temperature transition, etc., of the glass substrate W in this case.

Figure 5:
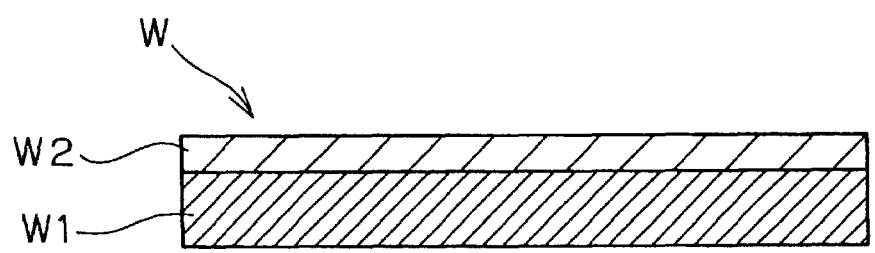
FIG. 5 is a cross-sectional view that shows the glass substrate.

First, as shown in FIG. 5, a glass plate W1 having a thickness of 0.5 to 1.1 mm (typically, 0.7 mm in thickness) is prepared. This glass plate W1 is generally used for an LCD display apparatus. On the glass plate W1 thus prepared, an amorphous silicon film W2 is formed, thereby preparing a glass substrate W.

In this heat treatment apparatus, the glass substrate W is loaded through the opening section 66 by the transporting robot, not shown, with the heat diffusion plate 73 and the heating plate 74 being placed at the loading and carrying-out position of the glass substrate W shown in FIG. 1, and placed on the supporting pin 70. Upon completion of the loading process of the glass substrate W, the opening section 66 is closed by a gate valve 68 (step S1). Thereafter, the heat diffusion plate 73 and the heating plate 74 are raised to the heat treatment position of the glass substrate W shown in FIG. 2 by a driving operation of an air cylinder 76.

The heat diffusion plate 73 and the heating plate 74 are preliminarily heated by the function of a heater built in the heating plate 74. For this reason, in a state in which the heat diffusion plate 73 and the heating plate 74 have been raised to the heat treatment position of the glass substrate W shown in FIG. 2, the glass substrate W is preliminarily heated by contacting the heat diffusion plate 73 which is in the heated state; thus, as shown in FIG. 4, the glass substrate W is successively heated (step S2).

In this preliminary heating process, the glass substrate W receives thermal energy from the heating plate 74 through the heat diffusion plate 73. Thus, even in the case when the temperature distribution of the heating plate 74 has not been completely made uniform, it is possible to heat the glass substrate W uniformly.

In parallel with this preliminary heating process, the heat treatment chamber 64 is pressure-reduced (step S3). In other words, the heat treatment chamber 65 is evacuated and pressure-reduced by connecting the discharge path 79 to a pressure-reducing mechanism, not shown, with the open-close valve 81 being released. In this case, in order to effectively obtain various effects, which will be described later, it is preferable to reduce the pressure of the heat treatment chamber 65 to a range from not less than $\frac{1}{10}$ atmospheric pressure to not more than $\frac{1}{1000}$ atmospheric pressure.

In this state, the glass substrate W is continuously heated through the heat diffusion plate 73. Here, at the time of the temperature raising process of the glass substrate W, a temperature sensor, not shown, always monitors whether or not the surface temperature of the glass substrate W, that is, the amorphous silicon film W2, has reached a preliminary heating temperature T1 (step S4).

Here, the preliminary heating temperature T1 is set to a temperature in a range from not less than 200° C. to not more than 400° C. Even when the glass substrate W is heated to the preliminary heating temperature T1 in this level, the amorphous silicon film W2 is not poly-crystallized. Moreover, the glass plate W1 is not susceptible to warping and distortion.

Immediately after the surface temperature of the glass substrate W has reached the preliminary heating temperature T1 shown in FIG. 4, the xenon flash lamp 69 is lighted on to carry out a flash heating process (step S5). The lighting time of the xenon flash lamp 69 in this heating process is set to a range from not less than 0.1 msec. to not more than 10 msec., and light is applied in an energy range from not less than 10 J/cm$^2$ to not more than 30 J/cm$^2$ with wavelengths ranging from visible light to infrared light. In this manner, in the xenon flash lamp 69, since electrostatic energy preliminarily accumulated is converted to extremely short light pulses, it is possible to apply extremely strong flash light.

In this state, the surface temperature of the glass substrate W is raised to a temperature T2 shown in FIG. 4. This temperature T2 is a temperature in a range of not less than 500° C. to not more than 600° C. that is required for the treatment of the glass substrate W. When the surface of the glass substrate W has been heated to such a treatment temperature T2, the amorphous silicon film W2 is crystallized to form a polysilicon film. In this state, the amorphous silicon film W2 at a portion that has been subjected to the light irradiation on the glass substrate W is fused by light energy, and re-crystallized to change into a poly-crystal silicon film.

The light irradiation energy at this time is appropriately adjusted by the film thickness of the amorphous silicon film W2 to be irradiated; however, since the film is preliminarily heated by an assisting heating process, the temperature is adjusted within the above-mentioned range.

In this case, since the surface temperature of the glass substrate W is raised to the treatment temperature T2 in an extremely short period of time from not less than 0.1 msec. to not more than 10 msec. so that the re-crystallization of the amorphous silicon film W2 on the glass substrate W is completed in a short time. Therefore, it is possible to shorten the treatment time, and also to prevent the glass plate W1 from being heated.

Moreover, prior to the heating process of the glass substrate W using the xenon flash lamp 69, the surface temperature of the glass substrate W is raised to the preliminary heating temperature T1 from not less than 200° C. to not more than 400° C. by using the heating plate 74; therefore, it is possible to readily heat the glass substrate W to the treatment temperature T2 in a range from not less than 500° C. to not more than 600° C. by using the xenon flash lamp 69.

During this flash heating process, the heating plate 74 receives light rays that have been transmitted through the heat diffusion plate 73 made of quartz. However, since the heating plate 74 is made from aluminum nitride of white color, it is possible to prevent the heating plate 74 from being burnt.

Moreover, the above-mentioned flash heating process is executed under a reduced pressure. For this reason, different from the conventional process, it is possible to prevent gas from reacting inside the heat treatment chamber 65 to spread particles or shifting the glass substrate W.

In the same manner, by reducing the pressure of the heat treatment chamber 65, it becomes possible to prevent a convection from occurring inside the heat treatment chamber 65, and consequently to heat the entire surface of the glass substrate W uniformly in the preliminary heating process and the flash heating process.

Moreover, by reducing the pressure of the heat treatment chamber 65, it becomes possible to remove oxygen and organic substances from the heat treatment chamber 65. Therefore, it is possible to prevent reduction in the service life of the heat treatment apparatus due to oxidation of the materials constituting the heat treatment chamber 65 and blackening of the organic substances.

Upon completion of the flash heating process, the open-close valve 81 is closed with air being introduced from the introduction path 78 so that the heat treatment chamber 65 is opened to atmosphere (step S6). Moreover, the heating process of the glass substrate W by the use of the heating plate 74 is stopped (step S7).

Here, immediately after the surface temperature of the glass substrate W has reached the preliminary heating temperature T1, the flash heating process is carried out, and upon completion of the flash heating process, the heat treatment chamber 65 is opened to atmosphere; the reason for these processes is described as follows:

In the heat treatment apparatus in this invention, since the heating plate 74 is placed inside the heat treatment chamber 65 under the low pressure, it is difficult to reduce the temperature of the heating plate 74 so that it becomes difficult to maintain the heating plate 74 at a desired temperature. In the case when a temperature-reducing part such as a Peltier element is used so as to eliminate this problem, there is degradation in the uniformity of the temperature with respect to the glass substrate W.

For this reason, in the heat treatment apparatus of the present invention, by carrying out the flash heating process immediately after the surface temperature of the glass substrate W has reached the preliminary heating temperature T1, the flash heating process is prevented from being executed at the time when the glass substrate W has reached a temperature higher than the preliminary heating temperature T1, and by releasing the heat treatment chamber 65 to atmosphere after completion of the flash heating process, the temperature of the heat treatment chamber 65 is rapidly cooled. Thus, as shown in FIG. 4, the temperature of the glass substrate W is quickly lowered after having a slight overshoot H with respect to the preliminary heating temperature T1.

After completion of release of the heat treatment chamber 65 to atmosphere, the heat diffusion plate 73 and the heating plate 74 are lowered to the loading and carrying-out position of the glass substrate W shown in FIG. 1 by the driving operation of an air cylinder 76, and the opening section 66 which has been closed by the gate valve 68 is released. Then, the glass substrate W placed on the supporting pin 70 is carried out by the transporting robot, not shown (step S8).

As described above, the amorphous silicon film W2 of the substrate W is heated by exposure of one lot by a flash light irradiation from the xenon flash lamp 69 so that it is possible to uniformly heat the entire surface of the amorphous silicon film W2 in a short time, and consequently to uniformly modify the silicon film. Consequently, it is possible to obtain a polycrystalline silicon film with high quality, and also to provide a TFT having superior characteristics.

Moreover, the amorphous silicon film W2 of the substrate W, which has been heated to the preliminary heating temperature T1 by the heating plate 74, is heated to the treatment temperature T2 by a flash heating process by the lighting of the xenon flash lamp 69; therefore, it is possible to carry out a heating process on the silicon film uniformly without using high energy in the flash heating process.

Furthermore, since the heating process is carried out in a short time, the throughput is improved so that the mass productivity is improved; thus, for example, it becomes possible to manufacture a liquid crystal display (LCD) panel using a TFT at low costs.

2. Second Embodiment

Figure 7:
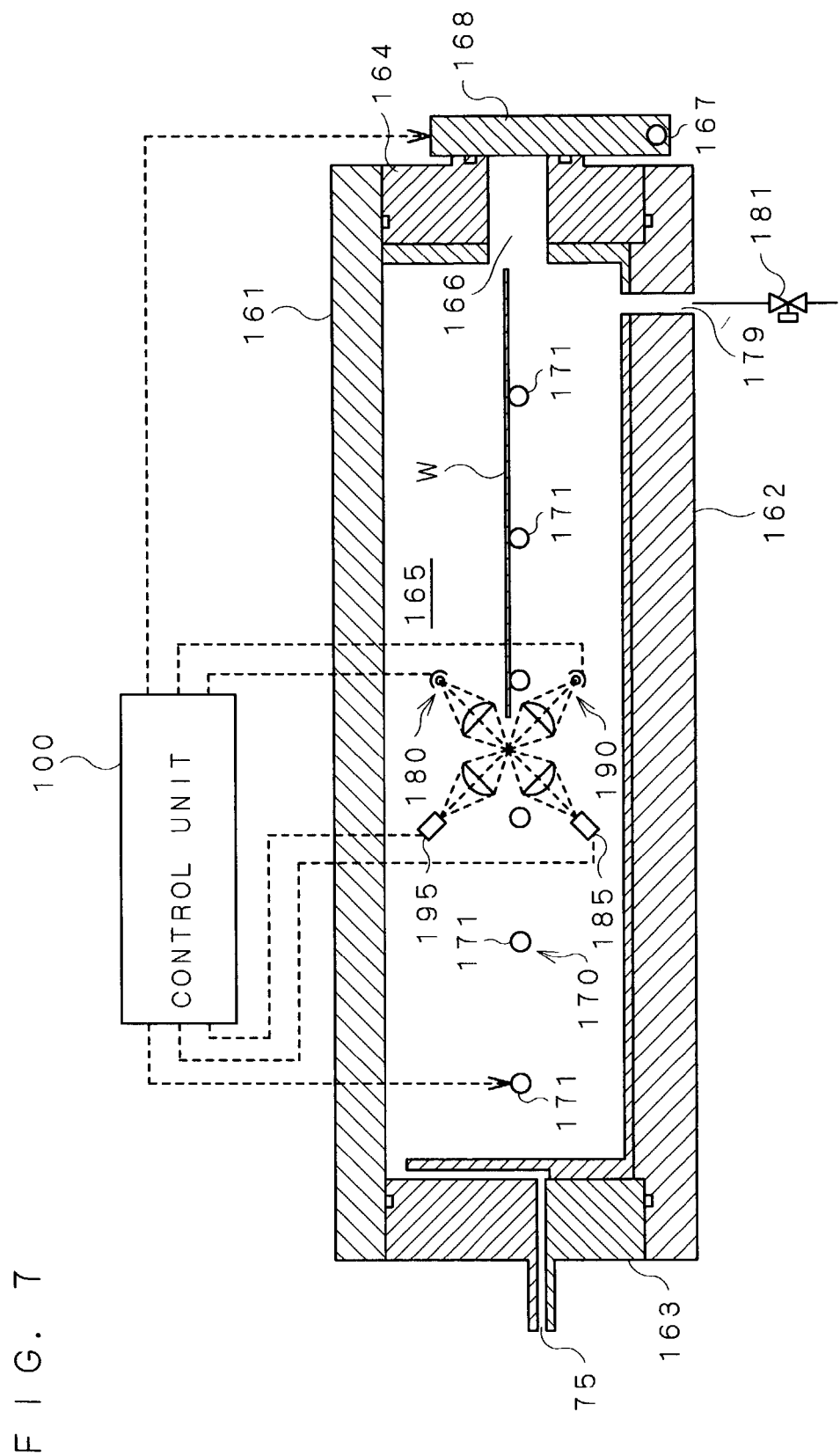
FIG. 7 is a side cross-sectional view of the heat treatment apparatus of a second embodiment.
Figure 8:
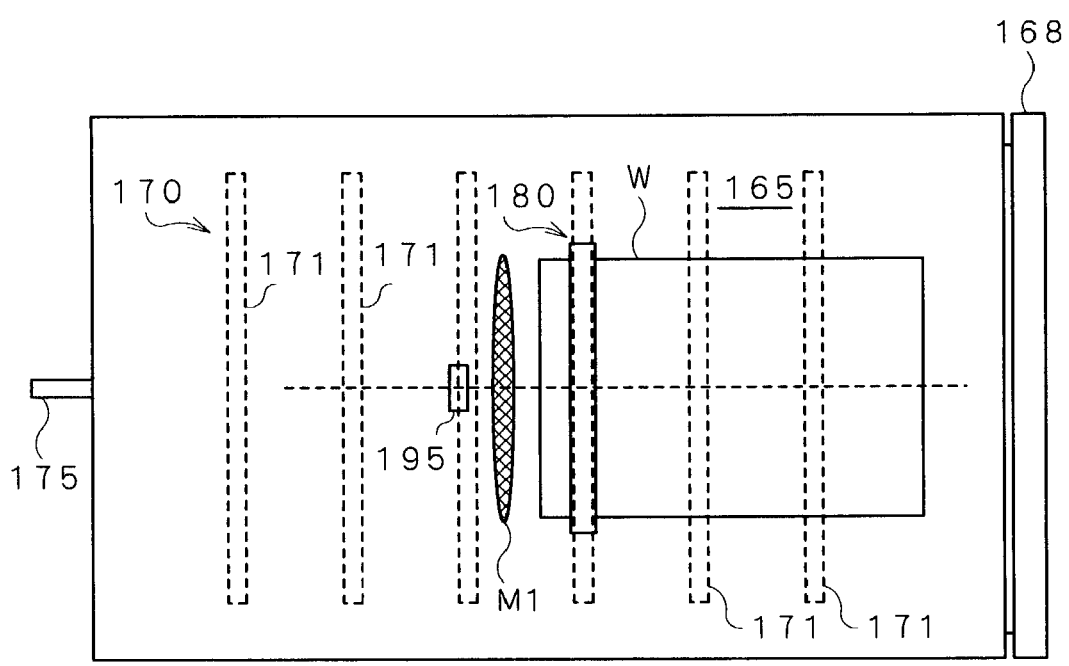
FIG. 8 is a plan view that shows a heat treatment apparatus of a second embodiment.
Figure 9:
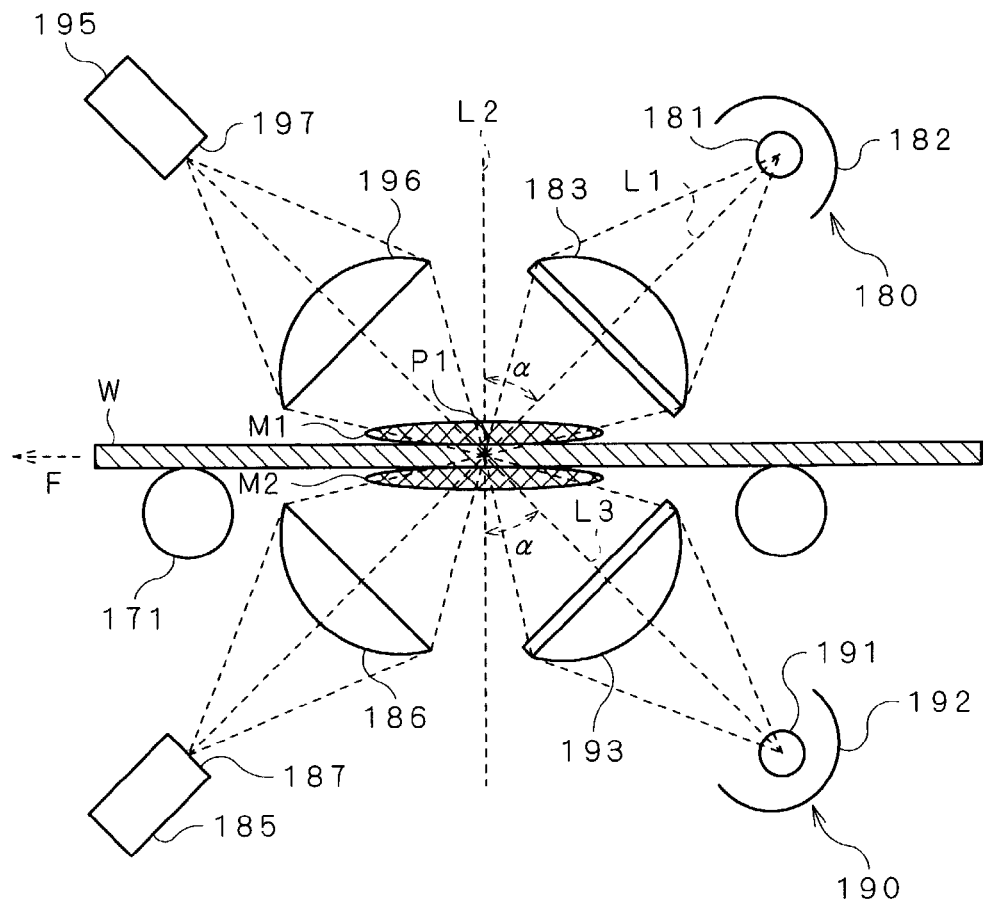
FIG. 9 is an enlarged drawing that shows an essential portion of the heat treatment apparatus of the second embodiment.

FIG. 7 shows a cross-sectional view of a heat treatment apparatus in accordance with a second embodiment of the present invention, and FIG. 8 is a schematic plan view thereof. Further, FIG. 9 is an enlarged view showing the inside of the heat treatment apparatus of the second embodiment.

This heat treatment apparatus, which is constituted by an upper plate 161, a bottom plate 162 and a pair of side plates 163, 164, is provided with a heat treatment chamber 165 which houses a glass substrate W having an amorphous silicon film formed thereon as a substrate to be treated therein, and caries out a heating treatment thereon. The respective plates 161, 162, 163, 164 constituting the heat treatment chamber 165 are made of a material, for example, stainless steel, and the surface of each of the plates is polished so as to prevent deformation due to heat radiation during the heat treatment process by flash light, which will be described later. Moreover, a transporting part 170 which transports the glass substrate W, while supporting it from the lower face thereof is placed in a space forming the heat treatment chamber 165.

The transporting part 170 inside the heat treatment chamber 165 is constituted by a plurality of transporting rollers 171 that are aligned in one row from the proximity of the opening section 166 toward the inside. The transporting rollers 171 are driven by a driving source, not shown, placed outside the side plates forming the heat treatment chamber 165 to rotate forwardly as well as reversely so that the glass substrate W is transported above the rollers 171.

Moreover, an opening section 166 to and from which the glass substrate W is loaded and carried out is formed in a side plate 164 that constitutes the heat treatment chamber 165. The opening section 166 can be opened and closed by a gate valve 168 that is allowed to pivot centered on an axis 167. The glass substrate W is loaded into the heat treatment chamber 165 by a transporting robot, not shown, with the opening section 166 being opened.

A flash heating part 180 is placed above the transporting part 170 of the heat treatment chamber 165. As shown in an enlarged manner in FIG. 9, the flash heating part 180 is constituted by placing one rod-shaped xenon flash lamp 181 in parallel with the transporting part 170. Further, a reflector 182 is placed above the xenon flash lamp 181, and a lens 183 serving as a light-converging device is placed diagonally below it.

This xenon flash lamp 181 is provided with a glass tube which has xenon gas sealed therein with an anode and a cathode connected to a capacitor being placed on the two ends thereof, and a trigger electrode that is wound on the periphery of this glass tube. Since the xenon gas is an electrically insulating material, no electric current is allowed to flow through the glass tube in a normal state. However, when a high voltage is applied to the trigger electrode to break the insulation, the electricity accumulated in the capacitor is allowed to flow through the glass tube so that the resulting Joule heat heats the xenon gas to emit light. In this xenon flash lamp 181, electrostatic energy, preliminarily stored therein is converted into extremely short light pulses in a range from not less than 0.1 msec. to not more than 10 msec. so that it is possible to apply an extremely stronger light in comparison with a light source of a continuous lighting system.

Figure 10:
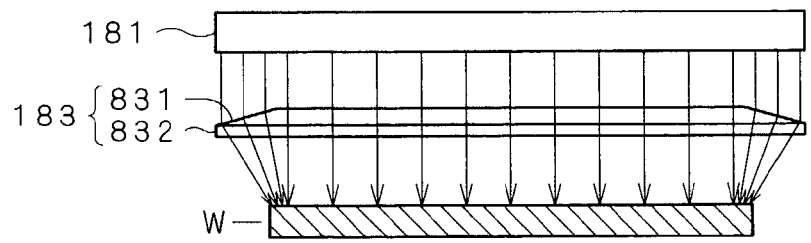
FIG. 10 is an explanatory drawing that shows a structure of a flash heating part in accordance with the second embodiment.

As shown in a side face view of FIG. 10, the lens 183 is constituted by a polarizing lens 831 that is made of quartz, and used for making the peripheral exposure uniform, and a glass plate 832 that is made of quartz or diffusion glass, and placed on the glass substrate W side of the polarizing lens 831.

Flash light from the xenon flash lamp 181 and reflected light from the reflector 182 are converged by the lens 183 to generate a belt-shaped light irradiation area M1 on the surface of the glass substrate W placed on the transporting means 170. This light irradiation area M1 has a stretch in the transporting direction F of the glass substrate W centered on point P1 at which a hypothetical line L1 connecting the xenon flash lamp 181 and the lens 183 crosses the surface of the glass substrate W, and also has a belt-shaped stretch having the same length as the width of the glass substrate W in the width direction (the direction perpendicular to the transporting direction F). Moreover, light is converged by the polarizing lens 831 at the two ends in the width direction of the glass substrate W so that the thermal gradient is corrected.

Here, the xenon flash lamp 181 is placed in a tilted manner so that hypothetical line L1 connecting the xenon flash lamp 181 and point P1 of the light irradiation area M1 makes an obtuse angle with the transporting direction F of the glass substrate W. More specifically, as shown in FIG. 9, the xenon flash lamp 181 is placed in a tilted manner on the upstream side in the transporting direction F from normal line L2 on the surface of the glass substrate W so that hypothetical line L1 and normal line L2 make an angle α. This angle α is set in a range of 0°<α<90°, preferably, 45°.

A pre-heating part 190 used for preliminarily heating the glass substrate W is placed below the transporting part 170 of the heat treatment chamber 165. The pre-heating part 190 is constituted by one rod-shaped halogen lamp 191 that is placed in parallel with the transporting part 170. Moreover, a reflector 192 is placed in the vicinity of the halogen lamp 191, and a lens 193 having the same structure as the lens 183 serving as the light-converging device is placed diagonally above the halogen lamp 191.

Light released from this halogen lamp 191 and light reflected from the reflector 192 are converged by the lens 193 so that a belt-shaped light irradiation area M2 is formed on the rear surface of the glass substrate W placed on the transporting part 170. This light irradiation area M2 is set so as to have the same size as light irradiation area M1 on the surface side of the glass substrate W, centered on a point at which hypothetical line L3 connecting the halogen lamp 191 and the lens 193 crosses the surface of the glass substrate W, that is, the above-mentioned point P1. As a result, the glass substrate W is subjected to light irradiation and heating process from both of the surface and rear surface sides in the same portions of the areas.

Here, the halogen lamp 191 is placed in a tilted manner so that hypothetical line L3 connecting the halogen lamp 191 and point PI of the light irradiation area M2 makes an obtuse angle with the transporting direction F of the glass substrate W. More specifically, as shown in FIG. 9, the halogen lamp 191 is placed in a tilted manner on the upstream side in the transporting direction F from normal line L2 on the surface of the glass substrate W so that hypothetical line L3 and normal line L2 make an angle α. This angle α is set in a range of 0°<α<90°, preferably, 45°. In other words, the halogen lamp 191 is placed at a position that is line-symmetrical to the xenon flash lamp 180, centered on the glass substrate W, and placed with the same tilted angle with the xenon flash lamp 180.

Moreover, on the downstream side in the transporting direction F of the glass substrate W, a first detector 195 is placed above the surface of the glass substrate W, and a second detector 185 is placed below the rear surface of the glass substrate W. The first detector 195 is constituted by a lens 196 that converges light that passes through the surface side of the glass substrate W along hypothetical line L3 connecting the halogen lamp 191 and the light irradiation area M2 and a light-receiving device 197. The second detector 185 is constituted by a lens 186 that converges light that passes through the rear surface side of the glass substrate W along hypothetical line L1 connecting the xenon flash lamp 181 and the light irradiation area M1, and a light-receiving device 187. When these light-receiving devices 187, 197 detect light, signals from the light-receiving devices 187, 197 are inputted into a control unit 100, which will be described later.

A glass substrate loading and carrying-out position (position shown in FIG. 7) inside the heat treatment chamber 165 is a position at which the glass substrate W transported from an opening section 166 by using a transporting robot, not shown, is placed onto the transporting rollers 171 or the glass substrate W placed on the transporting rollers 171 is carried out from the opening section 166.

In order to carry out a heat treatment on the glass substrate W, the glass substrate W is transported from a state shown in FIG. 7 toward the inner side of the heat treatment chamber 165 by the rotation of the transporting rollers 171. During this transporting process, the glass substrate W is heated on its surface and rear surface through the light irradiation areas M1, M2 formed between the transporting rollers 171, and the entire surface is subjected to light irradiation and heating process while being successively transported. When the entire surface of the glass substrate W has passed through the light irradiation areas M1, M2, the transporting rollers 171 are rotated reversely so that the glass substrate W is returned to its original loading and carrying-out position.

An introduction path 175 is formed in a side plate 163 on an opposite side to the opening section 166 in the heat treatment chamber 165. This introduction path 175 is used for introducing air at the time of a releasing process to atmosphere, which will be described later. Here, instead of introducing air, nitrogen gas or the like may be introduced.

Here, a discharge path 179 is formed in the bottom plate 162 of the heat treatment chamber 165. This discharge path 179 is connected to a pressure-reducing mechanism, such as a vacuum pump, through an open-close valve 181.

A control unit 100, which is constituted by a computer, controls a light irradiation process by the flash heating part 180 and the pre-heating part 190, a detection of the lamp state by the first detector 195 and the second detector 185, a transporting operation of the glass substrate W by the transporting part 170, opening and closing operations of the gate valve 168 and a gas discharging process inside the heat treatment chamber 165 by the pressure-reducing mechanism, in accordance with predetermined programs.

Figure 11:
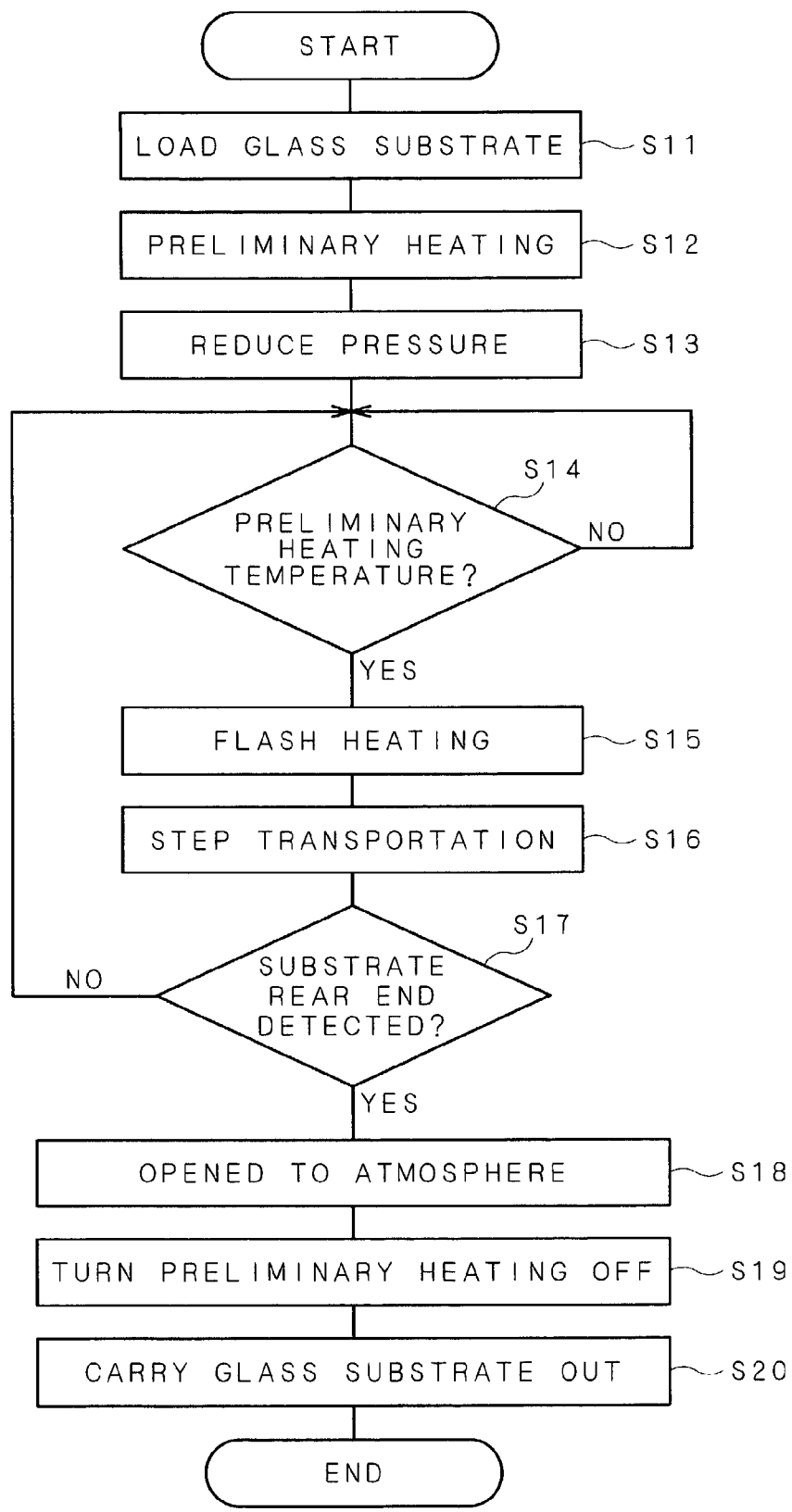
FIG. 11 is a flow chart that shows heat treatment operations on a glass substrate carried out by the heat treatment apparatus of the second embodiment.

Next, the following description will discuss heat treatment operations of the glass substrate W carried out by the heat treatment apparatus of the second embodiment. FIG. 11 is a flow chart that shows the heat treatment operations of the glass substrate W carried out by the heat treatment apparatus in accordance with the second embodiment, and FIG. 12 is a graph that shows the temperature transition of the glass substrate W in this case and transporting timing of the glass substrate.

In the same manner as the first embodiment, as shown in FIG. 5, first, a glass plate W1 having a thickness of 0.5 to 1.1 mm (typically, 0.7 mm in thickness) is prepared. This glass plate W1 is generally used for an LCD display apparatus. On the glass plate W1 thus prepared, an amorphous silicon film W2 is formed, thereby preparing a glass substrate W.

In this heat treatment apparatus, the glass substrate W is loaded through the opening section 166 by a transporting robot, not shown, with the gate valve 168 being opened, and placed on the loading and carrying-out position on the supporting rollers 171. Upon completion of the loading process of the glass substrate W, the opening section 166 is closed by the gate valve 168 (step S11). Thereafter, the transporting rollers 171 start to rotate at timing T11 shown in FIG. 12 so as to shift the glass substrate W in the transporting direction F.

Simultaneously as the transporting rollers 171 has started to operate, or when the detection part, not shown, has detected that the first treatment subject portion of the glass substrate W has reached the light irradiation area M2, the pre-heating part 190 starts to light the halogen lamp 191. Thus, the glass substrate W is preliminarily heated from the rear surface side, and as shown in FIG. 12, the temperature of the glass substrate W is successively raised (step S12).

In parallel with this lighting process of the pre-heating part 190, the heat treatment chamber 165 is pressure-reduced (step S13). In other words, the heat treatment chamber 165 is evacuated and pressure-reduced by connecting the discharge path 179 to a pressure-reducing mechanism, not shown, with the open-close valve 181 being released. In this case, in order to effectively obtain various effects, which will be described later, it is preferable to reduce the pressure of the heat treatment chamber 165 to a range from not less than 1/10 atmospheric pressure to 1/1000 atmospheric pressure.

When, after the glass substrate W has been transported, the first treatment subject portion on its surface is superposed on the light irradiation area M2, the control unit 100 stops the driving operation of the transporting rollers 171.

In this state, the glass substrate W is continuously heated by the pre-heating part 190. Here, at the time of the temperature raising process of the glass substrate W, a temperature sensor, not shown, always monitors whether or not the surface temperature of the glass substrate W, that is, the amorphous silicon film W2, has reached a preliminary heating temperature T1 (step S14).

Here, the preliminary heating temperature T1 is set to a temperature in a range from not less than 200° C. to not more than 400° C. Even when the glass substrate W is heated to the preliminary heating temperature T1 in this level, the amorphous silicon film W2 is not poly-crystallized. Moreover, the glass plate W1 is not susceptible to warping and distortion.

Immediately after the surface temperature of the glass substrate W has reached the preliminary heating temperature T1 shown in FIG. 12, the xenon flash lamp 181 is lighted on to carry out a flash heating process (step S15). The lighting time of the xenon flash lamp 181 in this heating process is set to a range from not less than 0.1 msec. to not more than 10 msec., and light is applied to the light irradiation area M1 in an energy range of from not less than 10 J/cm$^2$ to not more than 30 J/cm$^2$ with wavelengths ranging from visible light to infrared light. In this manner, in the xenon flash lamp 181, since electrostatic energy preliminarily accumulated is converted to extremely short light pulses, it is possible to apply extremely strong flash light.

In this state, the surface temperature of the glass substrate W is raised to temperature T2 shown in FIG. 12. This temperature T2 is a temperature in a range of not less than 500° C. to not more than 600° C. that is required for the treatment of the glass substrate W. When the surface of the glass substrate W has been heated to such a treatment temperature T2, the amorphous silicon film W2 is crystallized to form a polysilicon film. In this state, the amorphous silicon film W2 at the light irradiation area M1 that has been subjected to the light irradiation on the glass substrate W is fused by light energy, and re-crystallized to change into a poly-crystal silicon film.

The light irradiation energy at this time is appropriately adjusted by the film thickness of the amorphous silicon film W2 to be irradiated; however, since the film is preliminarily heated by a preliminary heating process, the temperature is adjusted within the above-mentioned range.

In this case, since the surface temperature of the glass substrate W is heated to the treatment temperature T2 in an extremely short period of time from not less than 0.1 msec. to not more than 10 msec. so that the re-crystallization of the amorphous silicon film W2 on the glass substrate W is completed in a short time. Therefore, it is possible to shorten the treatment time, and also to prevent the glass plate W1 from being heated.

Moreover, prior to the heating process of the glass substrate W after the xenon flash lamp 181 has been lighted on, the surface temperature of the glass substrate W is heated to preliminary heating temperature T1 from not less than 200° C. to not more than 400° C. by using the pre-heating part 190; therefore, it is possible to readily heat the glass substrate W to treatment temperature T2 in a range from not less than 500° C. to not more than 600° C. by using the xenon flash lamp 181.

During this flash heating process, the respective heating plates 161, 162, 163, 164, which constitute the heat treatment chamber 165, receive light rays that have not been absorbed by the amorphous silicon film W2. However, since the respective plates 161, 162, 163, 164 are made of stainless steel with each of the surfaces thereof being polished, it is possible to prevent the respective plates 161, 162, 163, 164 from being deformed by heat.

Moreover, the above-mentioned flash heating process is executed under a reduced pressure. For this reason, different from the conventional process, it is possible to prevent gas from reacting inside the heat treatment chamber 165 to spread particles or shifting the glass substrate W.

In the same manner, by reducing the pressure of the heat treatment chamber 165, it becomes possible to prevent a convection from occurring inside the heat treatment chamber 165, and consequently to heat the entire surface of the glass substrate W uniformly in the preliminary heating process and the flash heating process.

In the same manner, by reducing the pressure of the heat treatment chamber 165, it becomes possible to remove oxygen and organic substances from the heat treatment chamber 165. Therefore, it is possible to prevent reduction in the service life of the heat treatment apparatus due to oxidation of the materials constituting the heat treatment chamber 165 and blackening of the organic substances.

Moreover, both of the xenon flash lamp 181 and the halogen lamp 191 are placed on the upstream side in the transporting direction F from normal line L2 of the substrate W in a tilted manner by an angle α (see FIG. 9). For this reason, even when respective irradiation lights proceed along hypothetical lines L1, L3 and transmit through the glass substrate W, the xenon flash lamp 181 and the halogen lamp 191 are not directly exposed to the irradiation lights mutually emitted from each other. Consequently, constituent parts such as filaments constituting the respective lamps are prevented from degradation due to irradiation lights and heat radiation. In particular, since the halogen lamp 191 is not directly exposed to strong flash light from the xenon flash lamp 181, it is possible to use it with a longer service life.

Upon completion of the heating process of the first heat treatment portion of the substrate W, the control unit 100 drives the transporting rollers 171 from timing T12 so that the substrate W is shifted in the transporting direction F; thus, a step transporting process in which the second heat treatment portion is sent to the light irradiation areas M1, M2 is carried out (step S16). The transporting distance of this step transporting process is set to the same length as the light irradiation area M1, or a distance slightly shorter than this length. With this arrangement, even in the case of a large-size glass substrate W, the light irradiation area M1 is successively shifted step by step so that the entire surface thereof is subjected to the process without causing any gaps.

Then, as long as the rear end of the glass substrate W has not passed through the light irradiation area M1, the sequence returns to step S14 from step S17, and the heating processes from the preliminary heating process by the light irradiation heating to the flash heating process are carried out in the same manner as the first heat treatment portion. Even during the step transporting process, the preliminary heating process is continued by the pre-heating part 190, and when the heat treatment portion has reached the preliminary heating temperature T1, the flash heating process S15 is carried out. By repeating these operations, it is possible to carry out the heat treatment on the entire surface even in the case of a large-size glass substrate W.

During the heat treatment processes from step S14 to step S17, the first detector 195 and the second detector 185 respectively detect irradiation lights from the halogen lamp 191 and the xenon flash lamp 181. Then, the respective detectors transmit detection signals from the light-receiving device 197 and the light-receiving device 187 to the control unit 100. Thus, the control unit 100 monitors whether or not the xenon flash lamp 181 and the halogen lamp 191 are lighted on in synchronized timing in accordance with preset programs. In the case when the control unit 100 does not receive a signal from each of the light-receiving devices 187, 197 in synchronized timing with lighting-on of each of the lamps, for example, it stops the heat treatment apparatus in order to prevent a failure in the process of the glass substrate W, or displays an abnormal state on the operation panel. With this arrangement, it is possible to confirm an abnormal state of the lamps during the light irradiation heating process, and consequently to properly deal with the abnormal state quickly.

Here, when light rays are detected by the first detector 195 and the second detector 185, the light rays that have passed through the glass substrate W are detected so that signal levels given by the light-receiving devices 187, 197 become smaller. For this reason, detection set levels to be used by the control unit 100 need to be set to values that have been preliminarily obtained through experiments, etc.

Upon completion of the heat treatment process by detecting the fact that the rear end of the glass substrate W has passed through the light irradiation area M1, the open-close valve 181 is closed with air being introduced from the introduction path 175 so that the heat treatment chamber 165 is opened to atmosphere (step S18). Then, the halogen lamp 191 of the pre-heating part 190 is turned off (step S19). Moreover, the control unit 100 reversely rotates the transporting rollers 171 at timing T110 so that the glass substrate W is transported to the loading and carrying-out position, and stopped therein.

Here, immediately after the surface temperature of the glass substrate W has reached preliminary heating temperature T1, the flash heating process is carried out; the reason for these processes is described as follows: In the heat treatment apparatus in the second embodiment, by carrying out the flash heating process immediately after the surface temperature of the glass substrate W has reached preliminary heating temperature T1, the flash heating process is prevented from being executed at the time when the glass substrate W has reached a temperature higher than preliminary heating temperature T1.

In addition to this arrangement, by opening the heat treatment chamber 165 to atmosphere upon completion of the heating process on the entire surface of the glass substrate W, the temperature of the heat treatment chamber 165 is cooled.

After completion of opening of the heat treatment chamber 165 to atmosphere, the opening section 166 which has been closed by the gate valve 168 is released. Then, the glass substrate W placed on the transporting rollers 171 is carried out by the transporting robot, not shown (step S20).

With this arrangement, in the same manner as the first embodiment, the amorphous silicon film W2 of the substrate W is heated by exposure of one lot by a flash light irradiation from the xenon flash lamp 181 so that it is possible to obtain a polycrystalline silicon film with high quality, and also to provide a TFT having superior characteristics.

Moreover, since both of the xenon flash lamp 181 and the halogen lamp 191 are not directly exposed to the irradiation lights mutually emitted from each other, it is possible to improve the service life of the parts, and consequently to manufacture a liquid crystal display (LCD) panel using a TFT at low costs.

The following description will discuss maintenance processes in this heat treatment apparatus.

The flash heating part 180 and the pre-heating part 190 are provided with the first detector 195 and the second detector 185 that are placed in the respective light irradiation directions. The individual lighting processes of the xenon flash lamp 181 and the halogen lamp 191 are set through the operation unit, not shown, with the glass substrate W being unloaded, and the control unit 100 controls the lighting operations thereof. Signals, detected by the light-receiving devices 187, 197 derived from light irradiation of the lighting operation thereof, are inputted to the control unit 100. Then, the lighting states are determined by the ON/OFF states or intensity of these signals.

In other words, in the case when the xenon flash lamp 181 is not lighted on due to any failure, since no light is received by the light-receiving device 187 through the lens 186, no signal is outputted from the second detector 185. Then, the control unit 100 displays the failure of the xenon flash lamp 181 on the operation unit so that the operator is allowed to recognize the necessity of maintenance processes.

With this arrangement, it is possible to confirm any failure in the lighting operation of the xenon flash lamp 181 even though it is located inside the closed heat treatment chamber 165. Further, in the case of a weak lighting state thereof, any failure in the lighting operation is detected by carrying out the measurement at the portion having the highest light irradiation intensity. Moreover, even when there is any reflected light inside the heat treatment chamber 165, the influence of this is smaller than that of the detection light that is converged, thereby making it possible to carry out an accurate detecting operation.

Moreover, in the same manner, in the case of the first detector 195 corresponding to the halogen lamp 191 of the pre-heating part 190, it is possible to accurately detect the lighting state of the halogen lamp 191.

3. Third Embodiment

Figure 13:
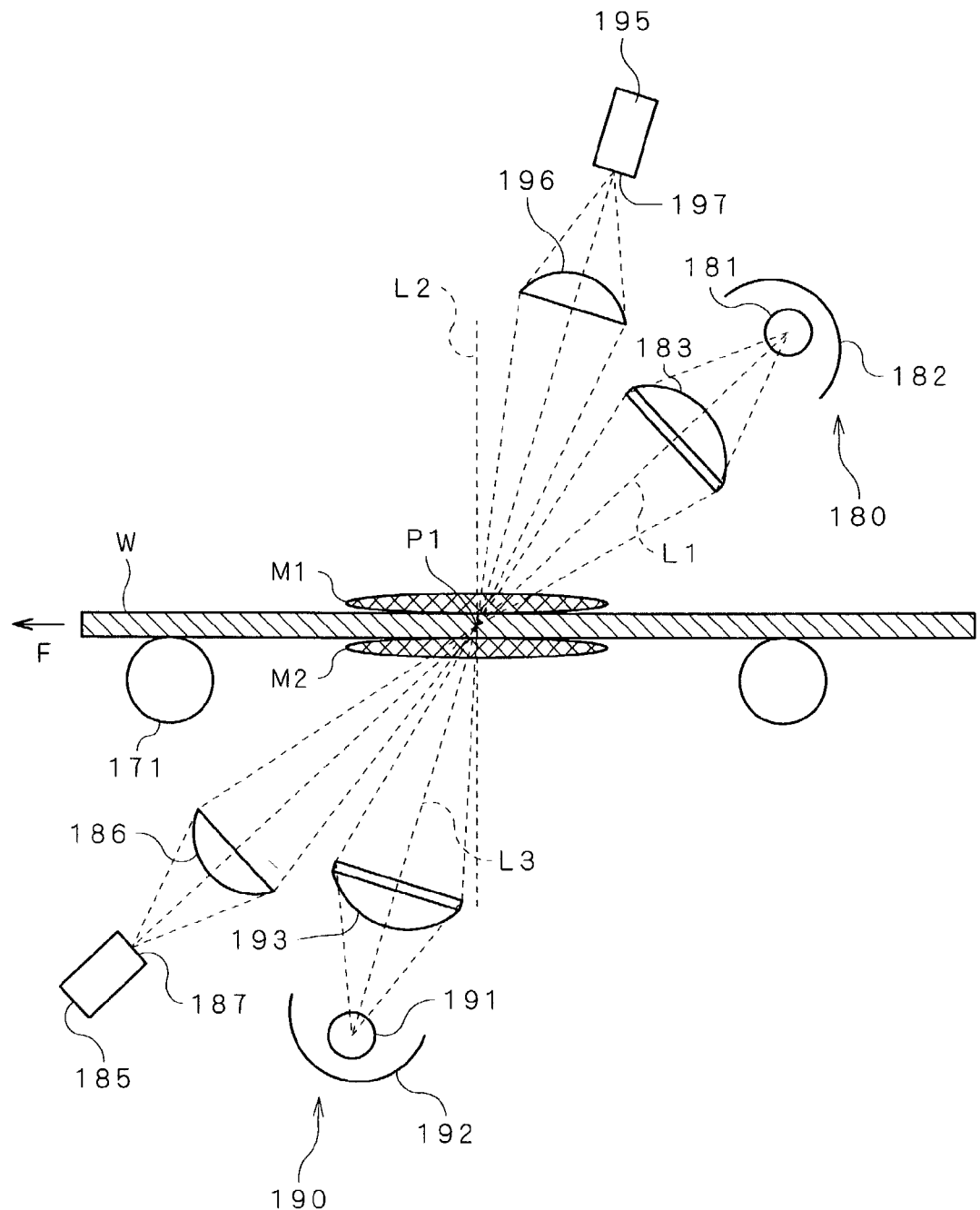
FIG. 13 is an enlarged drawing that shows an essential portion of a heat treatment apparatus in accordance with a third embodiment.

Referring to FIG. 13, the following description will discuss a third embodiment of the present invention. FIG. 13 is an enlarged view that shows an essential portion of the inside of a heat treatment apparatus in accordance with the third embodiment.

In this arrangement, a flash heating part 180 and a pre-heating part 190 are not placed in a tilted manner in the same direction (upstream side in the transporting direction F in the second embodiment) with respect to a normal line L2 in light irradiation area M1, and the pre-heating part 190 is placed at a position dislocated from hypothetical line L1 of the flash heating part 180 so that these are not exposed to the mutual irradiation light rays. With this arrangement, the first detector 195 can be placed in the proximity of the flash heating part 180 on the surface side of the glass substrate W; therefore, the layout position forms a position that is hardly susceptible to influences of the irradiation light rays from the flash heating part 180, and it becomes possible to reduce the influences of light from the flash heating part 180 to the first detector 195. On the rear surface side of the glass substrate W, in the same manner, it is possible to place the second detector 185 at a portion that is less susceptible to influences from the pre-heating part 190.

4. Modified Example

Additionally, the present invention is not intended to be limited by the above-mentioned embodiments; and the following other modes may be adopted.

(1) The above-mentioned embodiments have exemplified a case in which an amorphous silicon film is poly-crystallized; however, in addition to the afore-mentioned glass substrate on which an amorphous silicon film is formed, with respect to the glass substrate having a silicon film formed on the surface thereof, the heat treatment method of the present invention may be applied to other glass substrates on which various silicon films are formed, such as a glass substrate on which a silicon nitride film is formed and a glass substrate on which a polycrystal silicon film is formed. For example, an amorphous silicon film is formed by ion-injecting silicon into a polycrystal silicon film formed through a CVD method so as to be made amorphous, and an oxide silicon film, which serves a reflection preventive film, is further formed thereon. In this state, light irradiation is applied to the entire surface of the amorphous silicon film, and the amorphous silicon film may be subjected to the heat treatment of the present invention to be poly-crystallized to form a poly-crystal silicon film.

(2) A TFT substrate having a structure in which an $SiO_2$ serving as a base film and a polysilicon film formed by crystallizing amorphous silicon are placed on a glass substrate with the polysilicon film being doped with an impurity such as phosphor or boron is prepared, and this substrate may be subjected to the heat treatment of the present invention. The purpose of such a light irradiation process mainly lies in that the impurity injected therein through the doping process is activated and in that the film is modified. It becomes possible to provide a uniform process in such a process.

(3) Moreover, in the above-mentioned embodiments, an amorphous silicon film W2 is formed on a glass substrate W1 to provide a glass substrate W; however, a substrate formed by placing a silicon film on a flat plate made of another material may be used as treatment subject substrate, and this may be subjected to the heat treatment. With respect to materials other than glass plates, quartz plates, resin plates, etc. may be used, and a silicon film may be formed on these plates, and subjected to the heat treatment by using light irradiation. Moreover, the plate-shaped members on which a silicon film is formed may be transparent or translucent. Furthermore, with respect to the glass material constituting the glass plate W1, for example, alkali glass, soda lime glass, lead alkali glass, borosilicate glass, aluminosilicate glass, silica glass, etc. may be used. From the viewpoint of the costs, alkali glass is preferably used.

(4) Moreover, in the second and third embodiments, the light irradiation area is shifted on the glass substrate W by transporting the glass substrate W; however, the glass substrate W may be secured and held, while the flash heating part 180 and the pre-heating part 190 may be horizontally shifted so as to allow the light irradiation area to shift on the glass substrate W.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method, which carries out a heat treatment on a substrate by applying light onto said substrate, the method comprising the steps of:
   a) loading a glass substrate having a silicon film formed on a surface thereof into a heat treatment chamber, said glass substrate having a thickness of 0.5 mm to 1.1 mm;
   b) preliminarily heating said glass substrate loaded into said heat treatment chamber to a temperature of not less than 200° C. to not more than 400° C. with thermal energy from a heating plate;
   c) after having heated said glass substrate in said heat treatment chamber to a predetermined pre-heating temperature, applying flash light of a xenon flash lamp onto said glass substrate for an applying period of time from not less than 0.1 msec to not more than 10 msec, so that said silicon film formed on said surface of said pre-heated glass substrate is heated to a treatment temperature of not less than 500° C. to not more than 600° C., said xenon flash lamp having an irradiation intensity in a range from not less than 10 $J/cm^2$ to not more than 30 $J/cm^2$ when said xenon flash lamp is lighted;
   d) stopping the preliminarily heating process of said glass substrate by the use of said heating plate with said heat treatment chamber opened to the atmosphere; and
   e) carrying said glass substrate out of said heat treatment chamber.

2. A heat treatment method, which carries out a heat treatment on a substrate by applying light onto said substrate, comprising the steps of:
   a) loading a glass substrate having a silicon film formed on a surface thereof into a heat treatment chamber;
   b) preliminarily heating said substrate loaded into said heat treatment chamber to a temperature in the range of not less than 200° C. to not more than 400° C. with thermal energy from a heating plate;
   c) after having heated said glass substrate in said heat treatment chamber to a predetermined pre-heating temperature, applying flash light of a xenon flash lamp onto said glass substrate for an applying period of time from not less than 0.1 msec to not more than 10 msec, so that said silicon film formed on said surface of said pre-heated glass substrate is heated to a treatment temperature of not less than 500° C. to not more than 600° C.; said flash lamp having an irradiation intensity in a range from not less than 10 $J/cm^2$ to not more than 30 $J/cm^2$ when said xenon flash lamp is lighted;
   d) stopping the preliminary heating process of said glass substrate by the use of said heating plate with said heat treatment chamber open to the atmosphere; and
   e) carrying said glass substrate out of said heat treatment chamber.

3. The heat treatment method according to claim 2, wherein said glass substrate is a transparent substrate.

4. A method of carrying out a heat treatment on a substrate by applying light onto the substrate, the method comprising the steps of:
   a) loading a glass substrate having a silicon film formed on a surface of the substrate into a heat treatment chamber, the glass substrate having a thickness of 0.5 mm to 1.1 mm;
   b) pre-heating said glass substrate loaded into said heat treatment chamber to a pre-heating temperature in a range of not less than 200° C. to not more than 400° C. with thermal energy from a heating plate;
   c) after having heated said glass substrate in said heat treatment chamber to the predetermined pre-heating temperature applying flash light of a xenon flash lamp onto said glass substrate for an applying period of time from not less than 0.1 msec to not more than 10 msec, so that said silicon film formed on said surface of said pre-heated glass substrate is heated to a treatment temperature of not less than 500° C. to not more than 600° C., said flash lamp having an irradiation intensity in a range from not less than 10 $J/cm^2$ to not more than 30 $J/cm^2$ when said xenon flash lamp is lighted; and
   d) carrying said glass substrate out of said heat treatment chamber.

* * * * *